United States Patent [19]

Aprigliano et al.

[11] Patent Number: 5,164,361
[45] Date of Patent: Nov. 17, 1992

[54] METHOD TO PRODUCE CERAMIC SUPERCONDUCTING FILAMENTS BONDED TO METALS

[75] Inventors: Louis F. Aprigliano, Riva; Richard J. Stockhausen, Stevensville, both of Md.

[73] Assignee: The United States of America as represented by the Secretary of the Navy, Washington, D.C.

[21] Appl. No.: 373,072

[22] Filed: Jun. 29, 1989

[51] Int. Cl.$^5$ ............................................. H01L 39/24
[52] U.S. Cl. ...................................... 505/1; 29/599; 219/121.64; 219/121.66; 219/121.84; 505/705; 505/821
[58] Field of Search ................... 29/599; 505/1, 705, 505/815, 821; 427/53.1; 219/121.64, 121.63, 121.65, 121.66, 121.84

[56] References Cited

U.S. PATENT DOCUMENTS

| | | | |
|---|---|---|---|
| 3,507,038 | 4/1970 | Moll et al. | 29/599 |
| 4,732,778 | 3/1988 | Kawasaki | 427/53.1 |
| 4,820,688 | 4/1989 | Jasper, Jr. | 505/1 X |
| 4,883,922 | 11/1989 | Yokota et al. | 505/1 X |
| 4,925,830 | 5/1990 | Walsh | 505/1 |
| 4,965,245 | 10/1990 | Sugimoto et al. | 505/1 |

OTHER PUBLICATIONS

"High $T_c$ superconductors—composite wire fabrication", Jin et al. May 22, 1987.
"Lab vs. Factory", Wall Street Journal, Jul. 9, 1987.

*Primary Examiner*—Joseph M. Gorski
*Attorney, Agent, or Firm*—Luther Marsh; Charles D. Miller; Gary G. Borda

[57] ABSTRACT

A method for making superconducting ceramic filaments by joining the ceramic to a normal conducting metal in such a way that minimal mechanical working, drawing, or extrusion is needed to arrive at a fine filamentary shape.

10 Claims, 3 Drawing Sheets

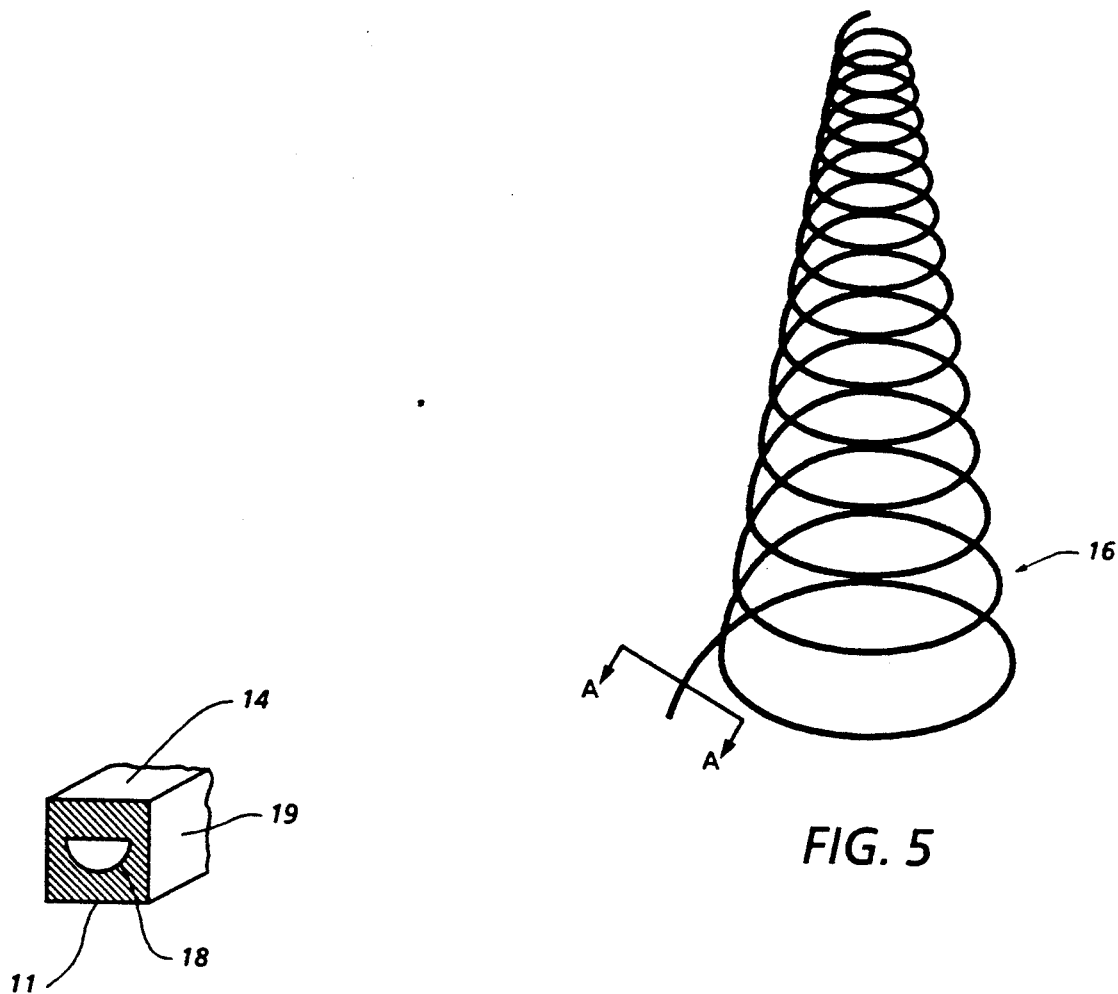
FIG. 5
FIG. 6
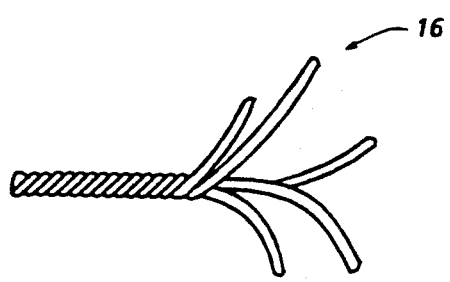
FIG. 7

METHOD TO PRODUCE CERAMIC SUPERCONDUCTING FILAMENTS BONDED TO METALS

The invention described herein may be manufactured and used by or for the Government of the United States of America for governmental purposes without the payment of any royalties thereon or therefor.

FIELD OF THE INVENTION

The present invention relates to the production or making filaments of superconducting ceramics by joining the ceramic to a normal conducting metal. More particularly the present invention relates to the production of filaments of superconducting ceramics in a physical form in which they are amendable to being twisted or braided into strands and the strands likewise into cables. The overall process can be automated.

BACKGROUND OF THE INVENTION

A class of ceramics has now been discovered that has the ability to superconduct electricity at liquid nitrogen temperatures (77° Kelvin). This ability to superconduct electricity at liquid nitrogen temperatures is a considerable improvement over the more conventional metallic alloys that superconduct at liquid helium temperatures (4° Kelvin). These ceramic materials, as a consequence of being brittle, are difficult to process into fine, twisted and wound filaments that are needed for the magnets that are used in electrical motors and generators. To prevent the violent failure of these magnets, the ceramic filaments must be mated or coated with normally conducting metals, without contaminating the ceramic materials, must be of a small diameter, typically 4 to $4000 \times 10^{-6}$ m, and must be twisted or braided into strands. Then, these strands in turn are twisted or braided together to make the cables which are then wound into the configuration of the desired magnet.

The superconducting filaments currently used involve the mating of superconducting metal to a normal conducting metal to prevent the violent destruction of a finished product, such as a magnet. The methods currently used to produce all metal superconducting filaments depend on the ductility inherent in the type of metal used, usually an alloy of niobium and titanium. The ductility allows the extrusion of fine filaments usually by inserting the superconducting metal into a tube of normal conducting metal and drawing the composite down into a fine filament. These methods are not successful when the superconductor material is a ceramic due to their brittleness.

The following U.S. patents illustrate some current methods of bonding a metal component to a solid ceramic substrate for state of the art utilization:

Arno Neidig et al in U.S. Pat. No. 4,591,401 illustrates a process for directly bonding a metal component, the surface of which is covered by an oxide layer after preoxidation, to a solid ceramic substrate, which comprises placing the metal component covered by an oxide layer on the solid ceramic substrate, heating the solid ceramic substrate with the metal component placed thereon to a temperature above the eutectic point of the metal and metal oxide but below the melting point of the metal, the combination therewith of forming parallel grooves, before said preoxidation on the surface of the metal component which is to be bonded to the solid ceramic substrate, and then effecting the heating to make the metal ceramic bond.

Another U.S. Pat. No. 4,470,537 illustrates the bonding of a solid piece of ceramic to a solid piece of metal by heating under pressure to a temperature below the melting point of both the metal and the ceramic for the purpose of increasing the strength of the bonded metal/ceramic structure. Zirconium metal is illustrated with silicon nitride being the ceramic material. The process may also be used for producing a ceramic material-to-ceramic material bonded by bonding two ceramic parts to a metal part therebetween.

The following articles illustrate the now considered common superconducting ceramic materials and their potential end use:

1. "Superconductors" in *Materials at Low Temperatures*, Section 13, by Ekin, J. W., The American Society, Metals Park, Ohio (1983).
2. Z. Phys. B—Condensed Matter, 64, 189-193 by Bednorz, J. G. and Muller, K. A. (IBM Zurich Research Laboratory, Ruschlikon, Switzerland) (1986).
3. Physical Review Letters, Volume 58, Number 9, 908-910 by M. K. Wu et al and P. H. Hor et al, (1987).

The present invention overcomes the inherent brittleness problem with the superconductor material when it is a ceramic by using a direct method to bond superconducting ceramic materials directly to the normal conducting metal.

SUMMARY OF THE INVENTION

It is an object of the present invention to provide for the production of making filaments of superconducting ceramics by joining the ceramic to a normal conducting metal in such a way that minimal mechanical working, drawing or extrusion will be needed to arrive at a fine filamentary shape.

With other objects in view, this invention provides a method of making filaments of a superconducting ceramic by directly joining the ceramic to a normal conducting metal in such a way that minimal mechanical working, drawing or extrusion is needed to arrive at a fine filamentary shape.

BRIEF DESCRIPTION OF THE DRAWING

The invention together with additional objects and advantages thereof will be best understood from the following description when read in connection with the accompanying drawings in which:

FIG. 5 shows a long filament produced when a laser beam cuts the disc between grooves.

FIG. 6 is an enlarged perspective view in section along line A—A of FIG. 5.

FIG. 7 shows twisting filaments into strands braiding strands into cables for use in magnets.

DETAILED DESCRIPTION OF THE INVENTION

Figure 1:
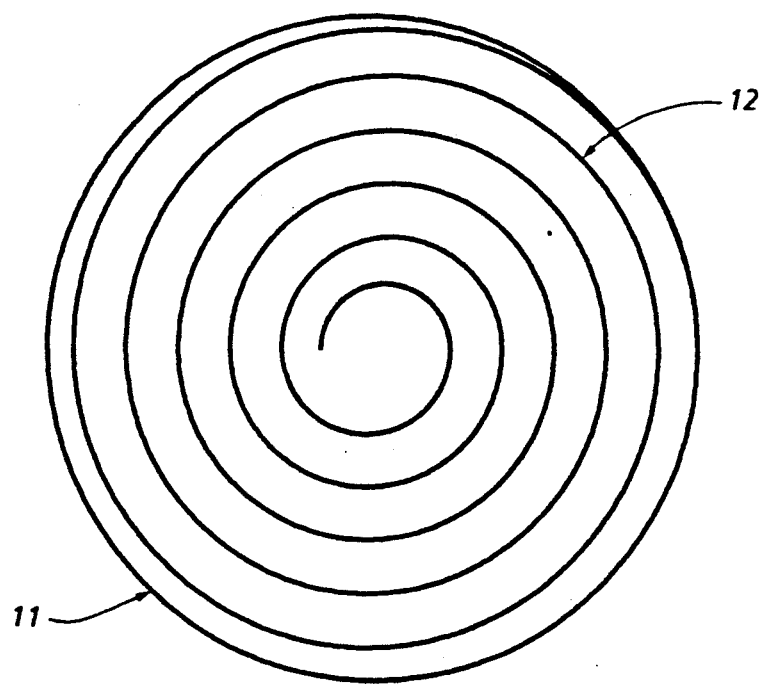
FIG. 1 shows a base metal disc having helical grooves.
Figure 2:
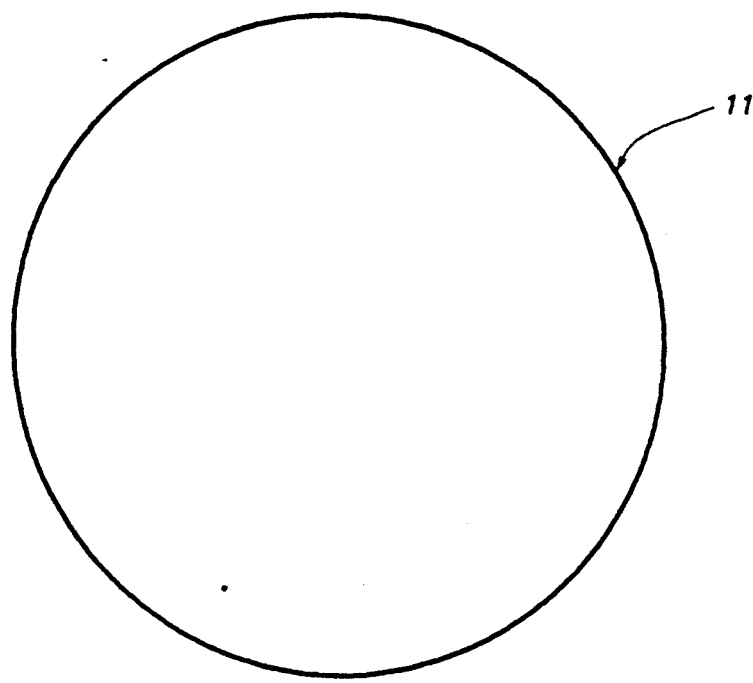
FIG. 2 shows a base metal disc without grooves.
Figure 3:
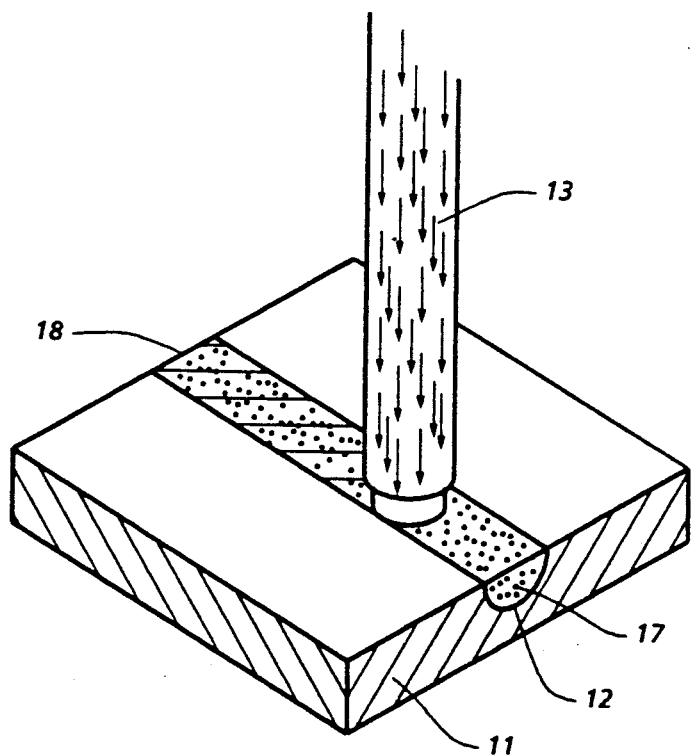
FIG. 3 is a partial perspective view in section of a base disc having helical grooves showing a laser beam for melting ceramic powder in the grooves.

Referring to FIGS. 1-3, the method of the present invention FIG. 1 having helical grooves 12 or FIG. 2 not having helical grooves of normal conducting metal or metal alloy of, for example, silver, gold, copper or platinum. The disc size can vary depending upon the length desired. If the helical grooved base disc 11 is utilized groove 12 will go from the outer edge base of disc 11 in a spiral to the center of the base disc 11. The base disc 11 thickness can vary from about 2 to $2000 \times 10^{-6}$ m. And, the groove 12 size can vary from about 1 to $1000 \times 10^{-6}$ m wide and 1 to $1000 \times 10^{-6}$ m deep. The lower limit is placed on groove 12 so that the ceramic powder will fit into it and the upper limit is placed so that the resulting filaments will be thin enough to allow for cryogenic cooling and for bending flexibility. The base disc 11 thickness is controlled by the need to contain the powder and to provide some stiffness to facilitate handling. The cross-sectional shape of groove 12 is not critical and the cross-sectional shape may be semi-circular, as in FIG. 3, elliptical, triangular, square or rectangular.

Any of the now common superconducting ceramic materials as discussed supra in J. G. Bednorz et al and M. K. Wu et al can be used. Referring to FIG. 3 ceramic materials 17, for use in the invention, are utilized in a powder form and can be placed in groove 12 long before heating by laser beam 13 or the ceramic materials 17 in a powder form can be delivered to groove 12 directly ahead of advancing laser beam 13. The ceramic powder material 17 is pre-mixed and reacted such that it has the final composition desired and is sized to fit into groove 12. A laser beam 13 in FIG. 3 is utilized to heat the ceramic powder material 17 sufficiently to melt and resolidify the ceramic powder in the groove 12 into one long continuous ceramic filament 18. The laser beam 13 is sized to enable it to focus on the ceramic powder material 17 only thus avoiding any overheating or melting of the conducting metal base disc 11. The travel speed of the laser is important to quality claddings. For example, with a continuous $CO_2$ laser we have found a speed of 100 inches/minute at a power density of 1375 joules/cm$^2$ to work well. Laser beam 13 is programmed, by automatic controls not shown, to track the groove 12 in the base disc 11 and may go from the outside to the center of base disc 11 or vice versa. The laser beam's intensity and speed are utilized to control the melting of the ceramic powder material 17 with minimal or no overheating or melting of conducting metal base disc 11. It is necessary to strictly limit the contamination of the finished ceramic product by the melting only of the ceramic powder. The finished ceramic product can only tolerate minor amounts (approximately 1 weight percent silver or copper) without degrading the superconducting properties. The melting and resolidifying of the ceramic powders form a continuous filament with all particles bonded and joined together. The melting and resolidifying is preferably carried out with a shield not shown, covering base disc 11 for providing oxygen, whenever oxygen is needed to properly correct the chemistry of the ceramic material. An inert gas, such as argon, can be used if the ceramic material chosen cannot tolerate contact with the ambient environment.

Grain alignment of the ceramic materials enhance its superconducting capability and in another preferred embodiment the melting and resolidifying is taking place in the presence of impressed magnetic or electrical fields in the shape of concentric circles which serve to align the grains of the ceramic materials as it solidifies along the path of the groove thus enhancing the final ceramic superconductor product.

Figure 4:
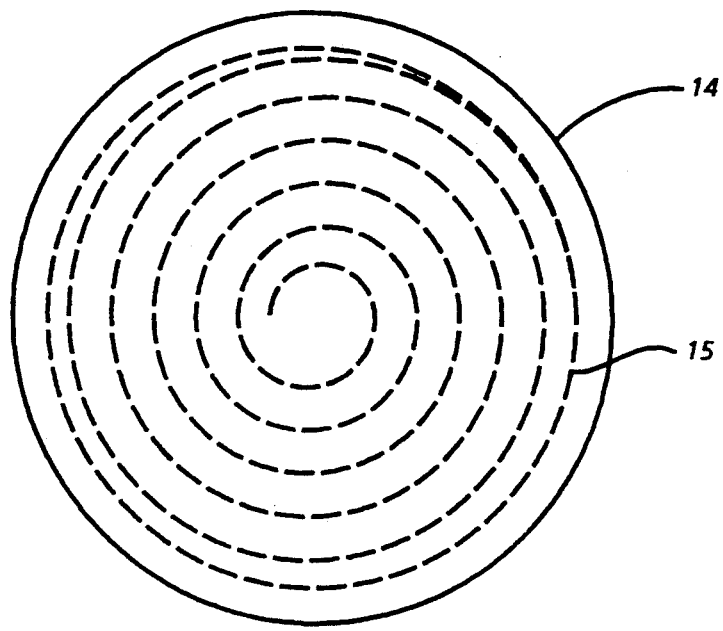
FIG. 4 shows a cover disc and laser track for cutting between grooves.

Referring now to FIGS. 3–7, upon final resolidification of the ceramic material 18 in the metal disc assembly, the properties of the final ceramic superconducting product is optimized by heat treating or annealing the assembly in appropriate environments to allow for needed crystallographic changes in the final ceramic product or for the uptake of desired amounts of oxygen. The shield is removed from the assembly, a thin cover disc 14, as shown in FIG. 4 (about 2 to $200 \times 10^{-6}$ m thick) is then placed over base conducting metal disc 11. A sandwich is thus formed of a fine continuous filament of superconducting ceramic material 18 between two layers of metal. The laser beam 13, using a cutting barrel, is then used to cut through the assembly in track 15, as shown in FIG. 4, that runs in the metal parallel to original groove 12 of base metal disc 11 Such cutting not only serves to cut through the assembly in track 15 but also closes the seam 19, as shown in FIG. 6, resulting between base and cover discs 11 and 14. The final ceramic superconducting product is a long continuous filament 16, as shown in FIG. 5, mated on all four sides with a normal conducting metal as shown in FIG. 6. Referring to FIG. 7, filament 16 is then wound with other filaments into strands and the strands into cables as needed for a magnet. The ultimate helical shape is thus close to the cylindrical form of most finished magnets which minimizes bending stresses exerted on the filaments during magnet winding.

Many other patterns can be made utilizing the teachings of the invention without using grooves. The ceramic material powder is poured directly onto the surface of the base conducting metal disc 11. The powder is packed and is about 0.5 mm to 2.0 mm thick. This broad thickness allows for a reasonable thickness of finished ceramic product with excellent bonding of the ceramic to the base conducting metal disc 11.

The base conducting metal disc 11 is preferably copper and silver and better laser heating and coupling is obtained by oxidizing the copper base disc 11 prior to the laser heating and coupling process step; and tarnishing the silver base disc 11 prior to the heating and coupling process step. To more easily get an adherent layer of oxide on copper base disc 11 it is preferable to heat copper base disc 11 at from about 725° C. to about 900° C. in air for from about 15 to about 60 minutes followed by furnace cooling. The copper oxide silver base disc 11 the tarnish amount only needs to be thick enough to take the shine from the surface, usually about 0.01 mm thick.

ADVANTAGES OF THE INVENTION

One advantage of the invention is to allow the successful production of ceramic superconductor filaments to be made. Another advantage of the invention is to allow the filaments to be further wound into cables for use in magnets. The basic advantage of the invention is that it provides a means to bond directly a thin filament ceramic to a metal in such a way that a long continuous filament of the two materials is the resulting product. Another advantage is by predesigning the helical configuration to the cylindrical shape of the ultimate end use product, a magnet, the filaments, strands and cables have already been "trained" into the starting shape of the end product. Another advantage is the direct melting with a laser of the ceramic powder to the base metal disc substrate which allows a direct consolidation of the powder into a continuous filament while simultaneously bonding the ceramic material to the metal. Another advantage of the invention is the laser heating means can be controlled to concentrate heat in such a way to melt the ceramic material into a fine filament. Another advantage of the invention is that for applications requiring superconducting filaments for conventional cables the base metal substrate can be grooved or ungrooved and in a longitudinal shape and the same basic method steps used in making fine filaments. Another advantage of the invention is that it can be used to melt and directly consolidate superconducting powders such as $YBa_2Cu_3O_x$, $ErBa_2Cu_3O_x$, $YbBa_2Cu_3O_x$, or $EuBa_2Cu_3O_x$, and it can be used to react various compounds that will form these superconductors. For example, we have used it to melt $Y_2Cu_2O_5 + 4BaCuO_2$ and $Y_2BaCuO_5 + 3BaCuO_2 + 2CuO$ to get superconducting $YBa_2Cu_3O_x$, wherein $x = 2-7.5$. Yet another advantage of the invention is that a long continuous spiral or non-spiral ribbon of superconducting ceramic bonded to metal for an end use as desired. Other advantages through modifications to the basic teaching of making ceramic superconducting filaments are available to those skilled in the art.

The embodiments illustrated are exemplary and variations can be made in construction and arrangement within the invention's scope as defined in the appended claims.

What is claimed is:

1. A method of making superconducting ceramic filaments which comprises:
   a) placing a powdered superconducting ceramic material directly onto a base conducting metal substrate in a predetermined conformation,
   b) melting the powdered superconducting ceramic material to said base conducting metal substrate by controlled heating of the ceramic material and substrate using a focused laser beam wherein said laser beam tracks the predetermined conformation of said powdered superconducting ceramic material and wherein the intensity and speed of said laser beam are controlled such that said powdered superconducting ceramic material is melted with substantially no melting of said base conducting metal substrate.
   c) causing the molten superconducting ceramic material to solidify, then,
   d) covering the superconducting ceramic material with a substrate of a conducting metal thereby forming a sandwich of superconducting ceramic material between the base and cover substrate of conducting metal,
   e) cutting said sandwich into thin filaments while simultaneously heating the filaments with each filament comprising the superconducting ceramic material surrounded by the metal of the substrates, and
   f) winding the filaments into strands and cables.

2. A method of making superconducting ceramic filaments as in claim 1 wherein the base conducting metal substrate is a disc.

3. A method of making superconducting ceramic filaments as in claim 2 wherein the disc is a grooved disc.

4. A method of making superconducting ceramic filaments as in claim 3 wherein the powdered superconducting material is placed in the grooves of the disc.

5. A method of making superconducting ceramic filaments as in claim 1 wherein the cutting of the sandwich is carried out using a focused laser.

6. A method of making preformed superconducting ceramic filaments comprising the steps of:
   disposing a powdered superconducting ceramic material in a predetermined configuration directly onto a first planar conducting metal substrate;
   heating said powdered superconducting ceramic material to a temperature sufficient to melt said powdered superconducting ceramic material, thereby melting said powdered superconducting ceramic material into a continuous filamentary shape without substantially melting said metal substrate, such that purity of the superconducting ceramic material is maintained at a level sufficient to prevent degradation of the superconducting properties of said superconducting ceramic material;
   causing melted superconducting ceramic material to solidify;
   placing a second planar conducting metal substrate on to said first planar conducting metal substrate over said superconducting ceramic material, thereby forming a sandwich; and
   cutting said sandwich into thin filaments while simultaneously heating the filaments thereby sealing a resulting seam between said first and second planar conducting metal substrates, wherein each filament comprises the metal of said first and second planar conducting metal substrates forming an outer covering around an inner core of continuous superconducting ceramic material.

7. A method of making preformed superconducting ceramic filaments as in claim 6 wherein the heating step is performed using a focused laser beam herein said laser beam tracks the predetermined configuration of said powdered superconducting ceramic material and wherein the intensity and speed of said laser beam are controlled such that said powdered superconducting ceramic material is melted with substantially no melting of said first planar conducting metal substrate.

8. A method of making preformed superconducting ceramic filaments as in claim 7 wherein the heating step results in less than approximately 1 weight percent contamination of said superconducting ceramic material by said first planar conducting metal substrate.

9. A method of making preformed superconducting ceramic filaments as in claim 7 wherein said laser beam is produced by a $CO_2$ laser, said laser having a tracking speed of approximately 250 cm per minute and having a power density of approximately 1375 joules per square centimeter.

10. A method of making superconducting ceramic filament coils comprising the steps of:
   disposing a powdered superconducting ceramic material in a helical configuration directly onto a conducting metal base substrate sad base substrate being a disk;
   heating said powdered superconducting ceramic material using a focused laser beam said laser beam tracking the helical configuration of said powdered superconducting ceramic material and wherein the intensity and speed of said laser beam are controlled whereby said powdered superconducting ceramic material is melted with substantially no melting of said base substrate such that said superconducting ceramic material is not substantially contaminated by said base substrate causing the molten superconducting ceramic material to solidify, then;

placing a conducting metal cover substrate onto said base substrate over said superconducting ceramic material wherein said cover substrate is a disk whereby a sandwich of superconducting ceramic material between said base and said cover substrates is formed; and cutting said sandwich in a path parallel to the helical configuration of said superconducting ceramic material using a focused laser beam whereby said sandwich is cut into helical filaments, said helical filaments being simultaneously heated such that a seam between said base substrate and said cover substrate is sealed, wherein each filament comprises the superconducting ceramic material surrounded by the metal of the substrates.

* * * * *